(12) United States Patent
Butzmann

(10) Patent No.: US 7,119,539 B2
(45) Date of Patent: Oct. 10, 2006

(54) ARRANGEMENT FOR DETERMINING THE POSITION OF A MOTION SENSOR ELEMENT

(75) Inventor: Stefan Butzmann, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 220 days.

(21) Appl. No.: 10/496,483

(22) PCT Filed: Nov. 25, 2002

(86) PCT No.: PCT/IB02/05047

§ 371 (c)(1),
(2), (4) Date: May 24, 2004

(87) PCT Pub. No.: WO03/046593

PCT Pub. Date: Jun. 5, 2003

(65) Prior Publication Data

US 2005/0007102 A1    Jan. 13, 2005

(30) Foreign Application Priority Data

Nov. 27, 2001  (DE)  ............................ 101 58 052

(51) Int. Cl.
  G01B 7/14   (2006.01)
  G01R 33/09  (2006.01)
  H01L 43/08  (2006.01)
  G01B 7/15   (2006.01)

(52) U.S. Cl. ............... 324/252; 324/207.21; 338/32 R

(58) Field of Classification Search ............. 324/166, 324/174, 179, 180, 252, 207.21, 207.25, 324/207.24; 338/32 R See application file for complete search history.

(56) References Cited

U.S. PATENT DOCUMENTS

| | | | | |
|---|---|---|---|---|
| 4,524,932 A * | 6/1985 | Bodziak | ..................... | 246/247 |
| 4,712,064 A * | 12/1987 | Eckardt et al. | ........ | 324/207.21 |
| 4,745,363 A * | 5/1988 | Carr et al. | ............... | 324/207.2 |
| 5,055,781 A * | 10/1991 | Sakakibara et al. | .... | 324/207.21 |
| 5,210,489 A * | 5/1993 | Petersen | ................ | 324/207.12 |
| 5,585,719 A * | 12/1996 | Endo et al. | .................. | 324/235 |
| 6,043,646 A * | 3/2000 | Jansseune | ............. | 324/207.26 |
| 6,107,793 A * | 8/2000 | Yokotani et al. | ....... | 324/207.21 |
| 6,144,197 A * | 11/2000 | Shimamura et al. | ........ | 324/166 |
| 6,366,079 B1 * | 4/2002 | Uenoyama | ............. | 324/207.21 |
| 6,922,052 B1 * | 7/2005 | Steinruecken et al. | ... | 324/207.2 |

* cited by examiner

Primary Examiner—Edward Lefkowitz
Assistant Examiner—Kenneth J. Whittington
(74) Attorney, Agent, or Firm—Aaron Waxler; Paul Im

(57) ABSTRACT

An arrangement for determining the position of a motion sensor element influencing the formation of a magnetic field, impressed on the arrangement, periodically along its motion co-ordinate, includes a sensor arrangement which is sensitive along a measuring direction aligned at least substantially parallel to the motion co-ordinate of the motion sensor element to at least the polarity of the magnetic field impressed on the arrangement and is adapted to supply a measuring signal in dependence upon a field component of the magnetic field impressed on the arrangement. The motion sensor element, arranged in a strip-shaped zone of a main surface extending along the motion co-ordinate of the motion sensor element includes periodically recurrent areas alternatively influencing the measuring field which is being formed parallel to the main surface and is at least substantially parallel to the motion co-ordinate of the motion sensor element.

9 Claims, 3 Drawing Sheets

ARRANGEMENT FOR DETERMINING THE POSITION OF A MOTION SENSOR ELEMENT

Figure 1:
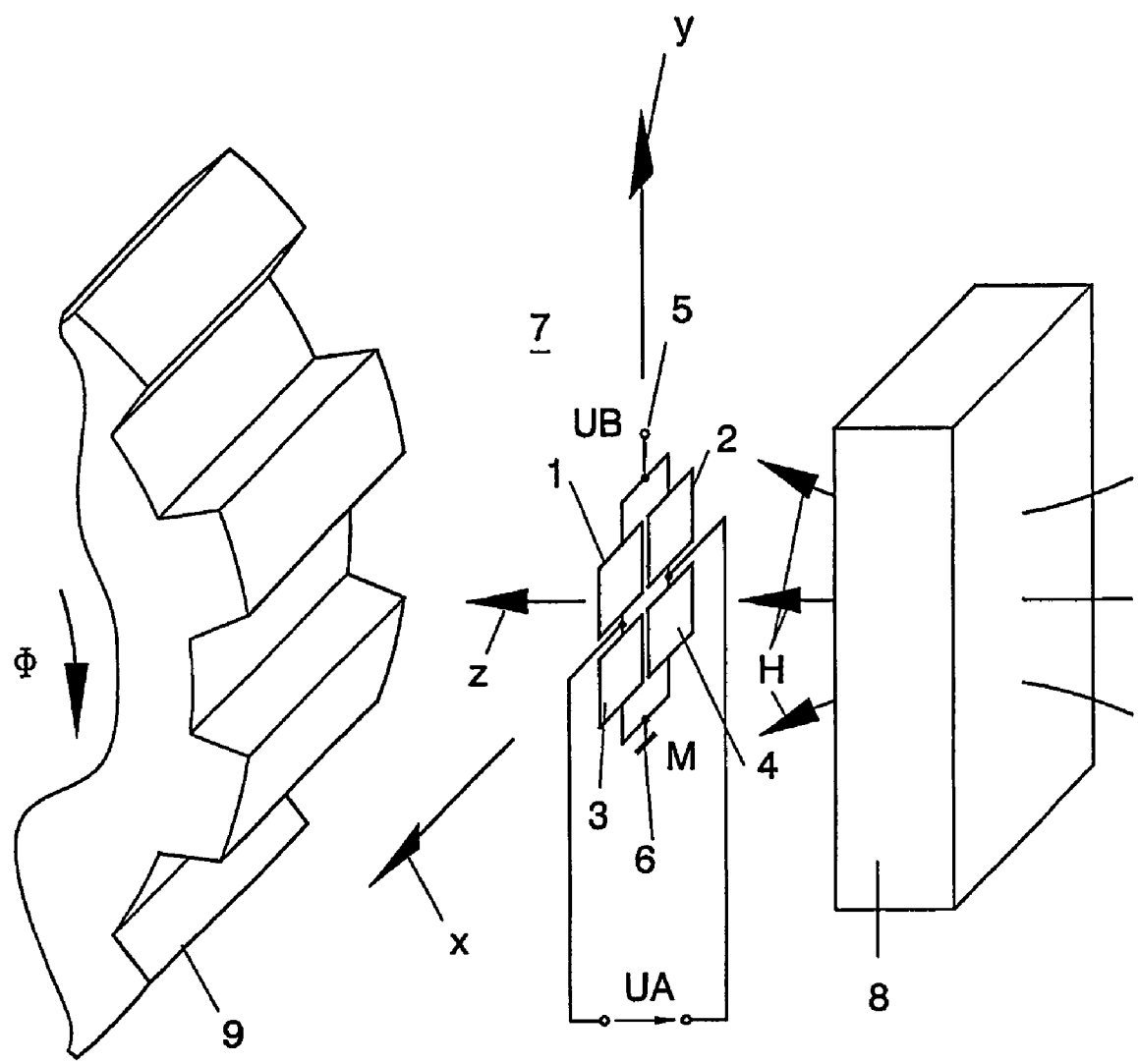

The invention relates to an arrangement for determining the position of a motion sensor element.

Arrangements for measuring the rotational speed of a rotating motion sensor element comprising a sensor arrangement utilizing the magnetoresistive effect have been described. This magnetoresistive sensor arrangement comprises four permalloy strips which are arranged on a silicon substrate in a meandering pattern and configured as a Wheatstone bridge. The magnetoresistive sensor arrangement is sensitive along a measuring direction to the polarity and the field strength of an external magnetic field and adapted to supply a measuring signal in dependence upon a field component of the magnetic field, denoted as measuring field and measured in the measuring direction.

Since, due to the magnetoresistive effect, a rotational movement of the motion sensor element cannot be directly measured, a permanent magnet denoted as working magnet is additionally fixed to the magnetoresistive sensor arrangement. This working magnet is stuck to the rear side of the magnetoresistive sensor arrangement or its housing so that the magnetoresistive sensor arrangement is permeated with the magnetic field of the working magnet, although in this assembly itself a field component of the magnetic field will not occur in the measuring direction without the motion sensor element. The measuring signal supplied by the magnetoresistive sensor arrangement is equal to zero in this configuration.

When a motion sensor element formed like a gear wheel of a ferromagnetic material is arranged in the vicinity of the sensor arrangement, this will lead to a change of the field variation of the magnetic field of the working magnet. To this end, the measuring direction of the magnetoresistive sensor arrangement is aligned in the direction of movement of the motion sensor element with respect to the teeth of the motion sensor element formed like a gear wheel of ferromagnetic material. The teeth of the motion sensor element thus move past the sensor arrangement in this measuring direction. Along the motion co-ordinate of the motion sensor element coinciding with the measuring direction, this leads to a distortion of the field lines of the magnetic field of the working magnet in the measuring direction of the sensor arrangement, which distortion occurs periodically with respect to the distance between the teeth of the gear wheel-like shape of the motion sensor element. In a "symmetrical" position, in which the sensor arrangement is centered in front of a tooth or in a gap between two teeth, the magnetic field is not distorted in the direction of movement of the motion sensor element, so that the output signal of the sensor arrangement is equal to zero in this position. In a "non-symmetrical" position, in which the sensor arrangement is neither centered in front of a tooth nor in front of a gap, the magnetic field is distorted in the direction of movement of the motion sensor element, which depends on the motion coordinate of the motion sensor element. The sensor arrangement thereby generates an output signal which is dependent on this motion co-ordinate of the motion sensor element, which output signal may be preferably at least substantially sinusoidal on the motion co-ordinate.

Such magnetoresistive sensor arrangements are used together with rotating motion sensor elements in diversified systems for detecting the number of revolutions of wheels, shafts or the like, coupled to the motion sensor elements. One of the most principal fields of application is their use in anti-blocking systems or as crankshaft rotational sensors in motor vehicles. The sensor arrangement is then conventionally operated in front of a gear wheel of a magnetizable material, with four resistors connected in a Wheatstone bridge configuration as described in the opening paragraph, in which the measuring direction, i.e. the magnetically sensitive direction of the sensor arrangement is parallel to the rotational direction co-ordinate of the gear wheel in the manner described.

As described, the output signal of the Wheatstone bridge can be represented in a first approximation by a sinusoidal signal on the motion co-ordinate of the motion sensor element, in which the zero-crossings in the output signal occur before the center of a tooth or before the center of a gap between two teeth of the motion sensor element. In the case of a moved motion sensor element, the position of the motion sensor element with respect to the sensor element can be unambiguously determined from the output signal.

An example of such an arrangement for measuring the rotational speed of a rotating motion sensor element with a sensor arrangement of the type described in the opening paragraph is shown diagrammatically in FIG. 1. In this Figure, the magnetoresistive sensor arrangement comprises four sensor elements 1, 2, 3, 4 which, in the manner described, comprise permalloy strips arranged on a silicon substrate in a meandering pattern and configured as a Wheatstone bridge. This Wheatstone bridge is arranged between a first power supply terminal 5, to which a first power supply potential UB is applied in operation, and a second power supply terminal 6, to which a second power supply potential M, preferably ground potential, is applied in operation. In the example shown, the sensor arrangement is planar arranged in a plane subtended by the x co-ordinate axis and the y co-ordinate axis of a Cartesian system of co-ordinates, to which plane a z co-ordinate axis is perpendicular. This magnetoresistive sensor arrangement is denoted in its entirety by the reference numeral 7.

Furthermore, a rectangular permanent magnet, referred to as working magnet 8, is mounted on the sensor arrangement 7. In a practical embodiment, this working magnet 8 is preferably stuck to the rear side of the sensor arrangement 7 or its housing so that the sensor arrangement 7 is permeated by the magnetic field H of the working magnet 8. The principal direction of the field lines of this magnetic field H extends along the z co-ordinate axis.

The magnetoresistive sensor arrangement 7 has a measuring direction along the y co-ordinate axis. Along this measuring direction, it is sensitive to the polarity and the field strength of an external magnetic field and is adapted to supply a measuring signal in dependence upon a field component of this magnetic field, denoted as measuring field and measured in the measuring direction. For operation, the external magnetic field is preferably and exclusively formed by the magnetic field H of the working magnet 8.

To measure the rotational speed of a rotating motion sensor element by means of the sensor arrangement 7 described hereinbefore, such a rotating motion sensor element 9 is positioned in front of the sensor arrangement 7 in the direction of the z co-ordinate axis. The motion sensor element 9 is formed from a ferromagnetic material in a gear wheel-shaped configuration and, in operation, rotates in the direction of a motion co-ordinate $\Phi$. Along the motion co-ordinate $\Phi$ of the motion sensor element 9, this leads to a distortion of the field lines of the magnetic field H of the working magnet 8 in the measuring direction of the sensor arrangement 7, situated in the direction of the y co-ordinate axis, which distortion occurs periodically with respect to the distance between the teeth of the gear wheel-like shape of the motion sensor element 9. The field component of the magnetic field H of the measuring direction situated in the direction of the y co-ordinate axis is denoted as measuring field. In the sensor arrangement 7, the measuring field generates a preferably at least substantially sinusoidal output signal UA via the motion co-ordinate Φ, which signal is dependent on this motion co-ordinate Φ of the motion sensor element 9.

A sensor chip is known from EP-A 0 607 595, which is particularly used for current and voltage measurement with a bridge circuit in the form of a Wheatstone bridge for measuring gradients of the magnetic field strength and consists of four magnetoresistive resistors which are arranged parallel and in two areas spaced apart from a central axis. Of these resistors, two series-arranged resistors constitute a bridge branch of the Wheatstone bridge, in which said two areas each comprise a magnetoresistive resistor of one bridge branch and a magnetoresistive resistor of the other bridge branch. The resistors of the two areas are arranged symmetrically with respect to the central axis. They consist of coating strips which are parallel to each other and to the other strips, provided with barberpole structures. These barberpole structures are equal at all resistances so that it is ensured that only an applied field gradient controls the bridge. As the distance between the two areas in this sensor chip, i.e. the basic length of the gradiometer is maintained small, the influence by interference magnetic fields is insignificant in accordance with the embodiments described in EP-A 0 607 595, but their sources are at a large distance from the measuring arrangement.

However, in operation, an arrangement of the type described hereinbefore for determining the position of a motion sensor element appears to supply an output signal to the sensor arrangement already without the presence of this motion sensor element, while the value of this output signal is dependent on the distance between the motion sensor element and the sensor arrangement measured in the direction of the z co-ordinate axis. This leads to strong distortions of the output signal of the sensor arrangement in operation, when dimension tolerances which are not too strict are used for the structure of the arrangement. Such an arrangement will thereby become much more expensive.

If, however, instead of the described sensor arrangement for measuring gradients of the magnetic field strength, i.e. instead of a gradient sensor, a sensor arrangement having a different structure is used, the freedom from interference of external magnetic fields, which is achievable in a simple way with the gradient sensor cannot be achieved at all or only with an increased number of components.

It is an object of the invention to provide an arrangement for determining the position of a motion sensor element which provides a reliable operation in a simple way without interference and is insensitive to dimension tolerances in its mechanical structure.

According to the invention, this object is solved by an arrangement for determining the position of a motion sensor element influencing the formation of a magnetic field, impressed on the arrangement, periodically along its motion co-ordinate, the arrangement comprising a sensor arrangement which is sensitive along a measuring direction aligned at least substantially parallel to the motion co-ordinate of the motion sensor element to at least the polarity of the magnetic field impressed on the arrangement and is adapted to supply a measuring signal in dependence upon a field component of the magnetic field impressed on the arrangement, denoted as measuring field and measured in the measuring direction, wherein the motion sensor element, arranged in a strip-shaped zone of a main surface extending along the motion co-ordinate of the motion sensor element, comprises periodically recurrent areas alternately influencing the measuring field which is being formed parallel to the main surface and is at least substantially parallel to the motion co-ordinate of the motion sensor element, and the measuring direction of the sensor element is aligned at least substantially parallel to the main surface of the motion sensor element, wherein the magnetic field impressed on the arrangement is aligned substantially perpendicular to the main surface of the motion sensor element with its main component determined by the principal direction of the magnetic field lines, wherein the sensor arrangement is formed as a magnetoresistive sensor arrangement for measuring gradients of the magnetic field, and wherein the magnetic field impressed on the arrangement is formed homogeneously in the area of the spatial extension of the magnetoresistive sensor arrangement. Said measuring signal represents the output signal of the sensor arrangement and will hereinafter also be referred to as such. The magnetoresistive sensor arrangement for measuring gradients of the magnetic field will hereinafter also be referred to as gradient sensor.

The invention is based on the recognition that a rectangular permanent magnet used as a working magnet produces an inhomogeneous magnetic field. A sensor arrangement arranged in front of such a magnet is thus permeated with an inhomogeneous magnetic field, with the result that the individual bridge branches of the sensor arrangement, i.e. the individual sensor elements, are subjected to different field strengths and directions of the impressed magnetic field. Since it is also apparent that the inhomogeneities of the magnetic field are dependent on the distance, measured in the direction of the z co-ordinate axis, between the motion sensor element and the sensor arrangement, not only the above-mentioned sensitivity to the dimension tolerances but also this distance is the result if the measures according to the invention are not taken.

The described inhomogeneity of the magnetic field H is shown diagrammatically in FIG. 1. Only within a very narrow area about a central axis of the working magnet 8 extending in the direction of the z co-ordinate axis are the field lines of the magnetic field H rectilinear, but in the other area they have a more or less strong curvature. This curvature additionally changes with the distance between the motion sensor element 9 and the working magnet 8. The different magnetic fields affecting the individual bridge branches and the sensor elements 1, 2, 3 and 4 arranged therein give rise to the fact that these sensor elements 1, 2, 3 and 4 are operated at different working points and therefore have different characteristics, i.e. a different small-signal behavior, which, moreover, changes relative to the motion sensor element 9 because of the built-in position of the sensor arrangement 7 and the working magnet 8.

In a simple way, the invention now eliminates the described dependence of the output signal of the sensor arrangement on inhomogeneities of the magnetic field and thus provides an arrangement for determining the position of the motion sensor element which is free from interference and is insensitive to manufacturing tolerances, which becomes manifest by an interference-free characteristic between the motion co-ordinates of the motion sensor element and the output signal of the sensor arrangement. This also provides the possibility of an unambiguous detection of the position of the motion sensor element with reference to the variation of this characteristic directly from the instantaneous value of the output signal. This allows immediate operation of the arrangement according to the invention, for example, after switching on the power supply potential.

In an advantageous further embodiment, the arrangement according to the invention comprises a working magnet for impressing the magnetic field on the arrangement, in which the main component of the magnetic field lines of the magnetic field emanating from the working magnet is aligned at least substantially perpendicular to the main surface of the motion sensor element. Advantageously, the working magnet in one of its upper surfaces facing the magnetoresistive sensor arrangement and being aligned substantially parallel thereto comprises projections directed towards the main surface of the motion sensor element in the direction of the main component of the magnetic field lines of the magnetic field emanating from the working magnet, i.e. substantially perpendicular to said main surface of the motion sensor element, said projections comprising the area of the spatial extension of the magnetoresistive sensor arrangement in at least the measuring direction. In other words, said surface of the working magnet is preferably formed like a trench; such a working magnet is also referred to as "trench magnet".

Due to this implementation of the invention, the advantage of a simple and low-cost generation of the magnetic field by a working magnet is combined with the robustness, achieved by the invention, against interferences and dimension tolerances.

In a further embodiment of the invention, the projections in the upper surface of the working magnet directed towards the main surface of the motion sensor element comprise the area of the spatial extension of the magnetoresistive sensor arrangement in at least all directions substantially parallel to the main surface of the motion sensor element. Therefore, the magnetic field of the working magnet can be homogenized in all of these directions, which leads to an overall improvement of said operating properties.

For a simple and efficient structure of the magnetoresistive sensor arrangement for measuring gradients of the magnetic field, the magnetoresistive sensor arrangement is formed for measuring gradients of the magnetic field with at least a Wheatstone bridge configuration whose bridge branches each comprise a magnetoresistive sensor element, and in which two series-arranged bridge branches each constitute a half bridge of the Wheatstone bridge configuration.

In accordance with a preferred embodiment of the invention, the magnetoresistive sensor elements are formed with barberpole structures, the barberpole structures in the magnetoresistive sensor elements of a half bridge of the Wheatstone bridge circuit are at least substantially aligned in a corresponding manner, and the alignment of the barberpole structures in the magnetoresistive sensor elements in at least one of the half bridges of the Wheatstone bridge circuit is chosen to be different from the alignment of the barberpole structures in the magnetoresistive sensor elements in at least another one of the half bridges of the Wheatstone bridge circuit. Such a structure of the gradient sensor is particularly simple and reliable in that the Wheatstone bridge circuit comprises a first half bridge of the series arrangement of a first and a third bridge branch and a second half bridge of the series arrangement of a second and a fourth bridge branch, in that the first, second, third and fourth bridge branch are formed with a first, a second, a third and a fourth magnetoresistive sensor element, and in that the barberpole structures of the first and the third magnetoresistive sensor element are aligned substantially right-angled to the barberpole structures of the second and the fourth magnetoresistive sensor element.

A preferred embodiment of the sensor arrangement according to the invention is obtained in that the magnetoresistive sensor elements have predetermined co-ordinates along a co-ordinate axis extending in the measuring direction, in that the co-ordinates of the first and the second magnetoresistive sensor element, on the one hand, and the co-ordinates of the third and the fourth magnetoresistive sensor element, on the other hand, at least substantially correspond to each other, and in that the co-ordinates of the first and the second magnetoresistive sensor element are chosen to be symmetrical to the co-ordinates of the third and the fourth magnetoresistive sensor element with reference to a point of reference on the co-ordinate axis extending in the measuring direction. The co-ordinates of the first and the second magnetoresistive sensor element determined with reference to said reference point are mutually at least substantially equal; in a corresponding manner, the co-ordinates of the third and the fourth magnetoresistive sensor element are also mutually at least substantially equal as regards said reference point, but have a sign which is reversed with respect to the coordinates of the first and the second magnetoresistive sensor element. This means that the values of all co-ordinates at least substantially correspond.

Advantageously, the zones of periodically recurrent areas alternately influencing the measuring field are constituted by projections alternating with indentations substantially perpendicular to the main surface of the motion sensor element, which projections and indentations are formed from a magnetizable material comprised by the motion sensor element. The motion sensor element thus has a toothed form. In operation, a deviation of the field lines of the magnetic field of the working magnet varying with the motion co-ordinate F is obtained due to these teeth. In a deviating embodiment, the zones of periodically recurrent areas alternately influencing the measuring field in the motion sensor element may also be formed by zones of periodically changed magnetization in the main surface of the motion sensor element.

The invention provides the possibility of a linear as well as a rotationally symmetrical implementation of the motion sensor element, i.e. for example as a gear wheel or as a toothed rack. In the rotationally symmetrical implementation, the main surface of the motion sensor element may be formed either by a cladding surface of an essentially cylindrical motion sensor element; then the main component of the magnetic field impressed on the arrangement extends essentially radially to the axis of rotation of the motion sensor element. However, the main surface may also be formed by an end face of a substantially cylindrical or disc-shaped motion sensor element; the main component of the magnetic field impressed on the arrangement then extends substantially axially with respect to the motion sensor element. For example, a cone-shaped form of the main surface of the motion sensor element is also possible.

These and other aspects of the invention are apparent from and will be elucidated with reference to the embodiments described hereinafter.

Figures 2, 3:
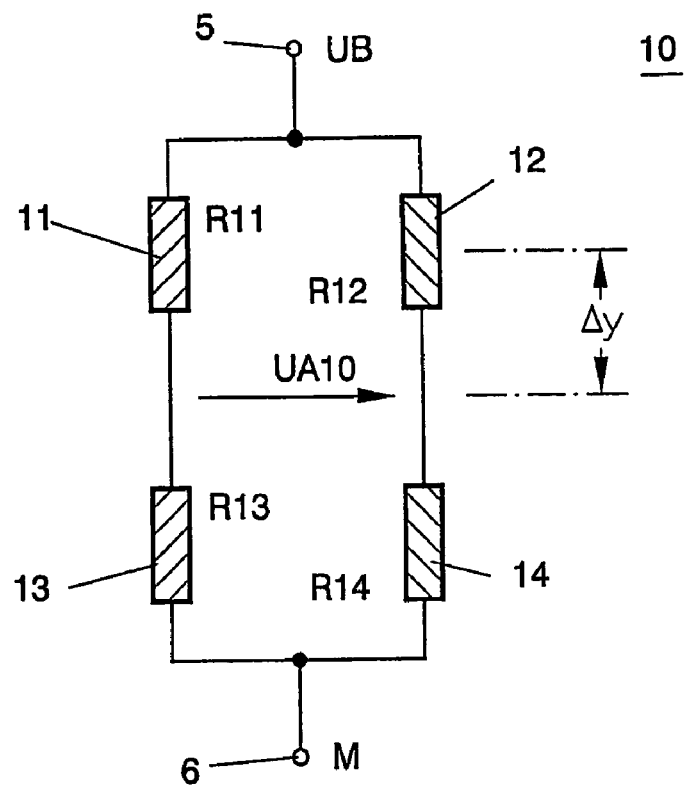
Figure 4:
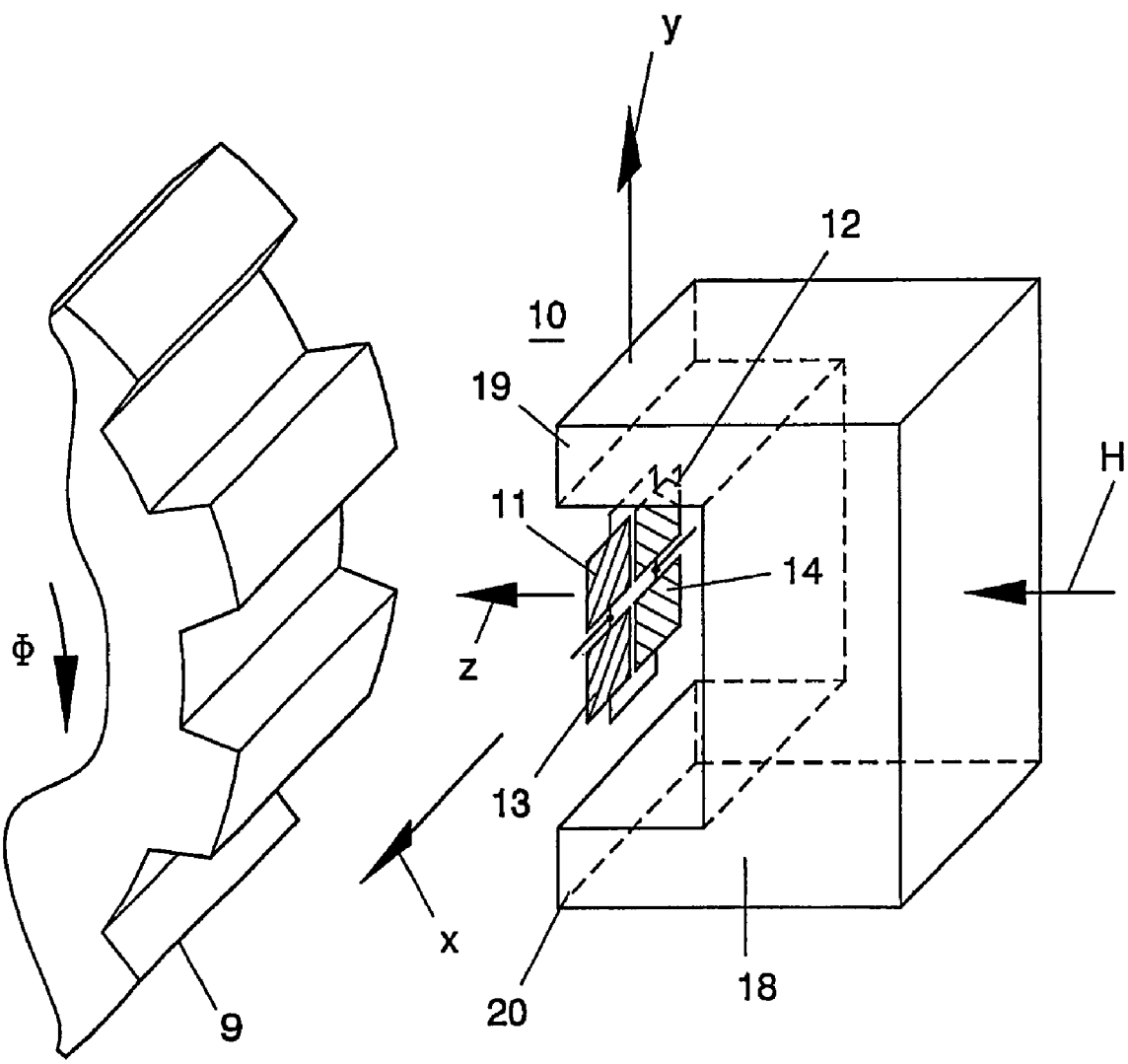

In the drawings:

FIG. 1 shows an example of an arrangement for measuring the rotational speed of a rotating motion sensor element, FIG. 2 shows an example of a gradient sensor in a circuit diagram FIG. 3 shows a spatial implementation of the gradient sensor of FIG. 2 and FIG. 4 shows an embodiment of an arrangement for measuring the rotational speed of a rotating motion sensor element according to the invention.

An example of such a sensor arrangement, denoted as gradient sensor 10, for measuring gradients of the magnetic field strength is shown in a circuit diagram in FIG. 2, in which elements corresponding to elements already described are denoted by the same reference numerals. The gradient sensor 10 comprises a first, a second, a third and a fourth sensor element 11, 12, 13 and 14 in a Wheatstone bridge configuration. The first and the third sensor element 11, 13, on the one hand, and the second and the fourth sensor element 12, 14, on the other hand, are arranged in series and connected to form a half bridge. These half bridges 13, 33 and 23, 43 are arranged between a first power supply terminal 5, which preferably conveys a power supply potential UB again, and a second power supply terminal 6, which preferably conveys ground potential M again. The bridge circuit is thus again connected via a power supply which, likewise as in FIG. 1, results from the difference between the power supply potentials UB, M.

The junction point between the first and the third sensor element 11, 13 is connected to a first tap 15 on the magnetoresistive sensor arrangement 10. In a corresponding manner, the junction point between the second and the fourth sensor element 12, 14 is connected to a second tap 16 on the Wheatstone bridge. An output signal UA10 of the magnetoresistive sensor arrangement 10 is taken between the first and the second tap 15 and 16.

The first, second, third and fourth sensor elements 11, 12, 13 and 14 of the magnetoresistive sensor arrangement 10 have resistances R11, R12, R13 and R14, respectively.

The first and the second sensor element 11, 12 of the magnetoresistive sensor arrangement 10 are positioned along an y co-ordinate axis with a first co-ordinate corresponding for these two sensor elements 11, 12

$$y1=y2=+\Delta y$$

with respect to a spatial central axis 17 extending along an x co-ordinate axis in a plane subtended by these x and y co-ordinate axes. The third and the fourth sensor element 13, 14 of the magnetoresistive sensor arrangement 10 are positioned in the same plane along the y co-ordinate axis with a second co-ordinate also corresponding for these two sensor elements 13, 14

$$y3=y4=-\Delta y$$

with respect to the spatial central axis 17. As regards the value, the first and the second coordinate thus correspond.

In FIG. 2, different shaded areas of the individual sensor elements 11, 12, 13, 14 indicate that they are formed with barberpole structures, in which the alignments of the barberpole structures regarding the directions of electric currents produced by the power supply potential UB and flowing through the sensor elements 11, 12, 13 and 14 are indicated by the directions of the slanting lines in the shaded areas. The selection of the barberpole structures of the sensor elements 11, 12, 13, 14 is made in such a way that the resistances R11 and R13 of the first and the third sensor element 11, 13 are increased by the positive value of the magnetic field strength of the measuring field and that the resistances R12 and R14 of the second and the fourth sensor element 12, 14 are reduced by the positive value of the magnetic field strength of the measuring field. To this end, the angle $\alpha_i$ of the direction of the current flowing through the sensor element i at a vanishing measuring field $H_i$ at the location of the sensor element i, with i=11, 12, 13, 14 is chosen to be as follows:

$$\alpha_{11}=+45°, \alpha_{12}=-45°, \alpha_{13}=+45°, \alpha_{14}=-45°$$

FIG. 3 is a possible spatial implementation of the sensor arrangement 10, shown in FIG. 2, in a plan view on the plane subtended by the x co-ordinate axis and the y coordinate axis. The barberpole structures are shown diagrammatically and, for the sake of clarity, their alignments in the individual sensor elements 11, 12, 13, 14 are represented by symbols 21, 22, 23 and 24 shown next to the individual sensor elements 11, 12, 13 and 14.

For the measuring field at the location of the individual sensor elements i=11, 12, 13, 14 the following applies in a first approximation:

$$H_i = H_{offi} + H_{pk} \sin(n\Phi - n\, y_i/r) + H_{ex}$$

Herein:

$H_i$ is the magnetic field strength of the measuring field at the sensor element i with the resistance Ri $H_{Offi}$ is the offset part of the magnetic field strength of the measuring field at the sensor element i, particularly produced by the described inhomogeneities of the measuring field along the measuring direction and particularly dependent on the distance between the motion sensor element 9 and the sensor arrangement 7 in the direction of the z co-ordinate axis $H_{pk}$ is the amplitude of the magnetic field strength of the measuring field at the sensor element i n is the number of teeth on the motion sensor element 9 formed as a sensor wheel $\Phi$ is the motion co-ordinate of the motion sensor element 9 (e.g. crankshaft angle of rotation)

r is radius of the motion sensor element 9 formed as a sensor wheel $y_i$ is the co-ordinate of the sensor element i along the y co-ordinate axis (preferably the center of the spatial extension of the sensor element i along the y co-ordinate axis extending in the measuring direction)

$H_{ex}$ is the magnetic field strength of an external magnetic field superimposed throughout the plane of the sensor arrangement 7, particularly an interference field, at the sensor element i i is the index with i=11, 12, 13, 14.

The following relation applies for the resistances Ri of the individual sensor elements i:

$$Ri = R_0 + S\, H_i \text{ or } Ri = R_0 - S\, H_i$$

wherein $R_0$ is the resistance of the individual sensor elements i at the working point, i.e. at a vanishing measuring field $H_i$, S is the resistance change of the resistances Ri in dependence upon the measuring field, i.e. the slope of the R-H characteristic curve of the sensor elements i or the sensitivity of the sensor elements i, and i is the index with i=11, 12, 13, 14 and the sign before the second addend in these equations depends on the choice of the angle $\alpha_i$ of the direction of the current through the sensor element i at a vanishing measuring field $H_i$ at the location of the sensor element i, with i=11, 12, 13, 14, i.e. dependent on the choice of the alignment of the barberpole structures regarding the electric currents flowing through the sensor elements 11, 12, 13 and 14.

For the resistances R11, R12, R13, R14 of the individual sensor elements 11, 12, 13, 14 of the sensor arrangement 10 of FIG. 2, the following relations apply:

$$R1 = R_0 + S(H_{Off1} + H_{pk}\sin(n\Phi - n\ y_1/r) + H_{ex})$$

$$R2 = R_0 + S(H_{Off2} + H_{pk}\sin(n\Phi - n\ y_2/r) + H_{ex})$$

$$R3 = R_0 + S(H_{Off3} + H_{pk}\sin(n\Phi - n\ y_3/r) + H_{ex})$$

$$R4 = R_0 + S(H_{Off4} + H_{pk}\sin(n\Phi - n\ y_4/r) + H_{ex})$$

At the location of the sensor elements i, with i=11, 12, 13, 14 of the magnetoresistive sensor arrangement 10, the above-mentioned offset parts, denoted by $H_{offi}$, of the magnetic field strength of the measuring field are effective particularly due to the described inhomogeneities of the measuring field along the measuring direction and particularly dependent on the distance between the motion sensor element 9 and the sensor arrangement 7 in the direction of the z co-ordinate axis. Assuming that there are symmetrical co-ordinates $y_1$, $y_2$, $y_3$ and $y_4$ of the sensor elements 11, 12, 13, 14 in the case of a symmetrical structure of the sensor arrangement 10 regarding the x co-ordinate axis, the following values are obtained for the offset parts $H_{offi}$ of the magnetic field strength of the measuring field $$H_{off1} = H_{off2} = -H_{off3} = -H_{off4} = H_{off}$$

With the above-mentioned relations, the following value is obtained in a first approximation as an output signal UA10 of the sensor arrangement 10:

$$UA10/UB = R13/(R11+R13) - R14/(R12+R14)$$
$$= -(SH_{Off}/R_0) + (SH_{pk}/R_0)\cos(n\Phi)\sin(n\Delta y/r)$$

It can be seen that, due to the use of this gradient sensor 10, only the influence of external magnetic fields and thus also external interference fields can be eliminated at least in a first approximation, but that the influence of the offset parts of the magnetic field strength of the measuring field remains on the sensor elements. Since these offset parts of the magnetic field strength of the measuring field at the sensor elements as described are dependent on the distance between the sensor arrangement 60 and the motion sensor element 9 along the z co-ordinate axis, the resultant impairments of the output signal UA10 are not acceptable for a flawless operation of the sensor arrangement 10.

FIG. 4 shows an embodiment of the invention with which the above-mentioned drawbacks can be eliminated. To this end, the gradient sensor 10 as shown in, for example, FIGS. 2 and 3, together with a working magnet 18 having a changed form is arranged in the arrangement, shown in FIG. 4, for determining the position of a motion sensor element 9. This changed form is constituted in that the working magnet 18 has projections 19 and 20 in those of its surfaces facing the magnetoresistive sensor arrangement 10 and being aligned substantially parallel thereto, in the direction of the main component of the magnetic field lines of the magnetic field H emanating from the working magnet 18, i.e. in the direction of the z co-ordinate axis and thus substantially perpendicular to the main surface of the motion sensor element 9, which projections are directed towards this main surface of the motion sensor element 9 and comprise the area of the spatial extension of the magnetoresistive sensor arrangement 10 at least in the measuring direction which is given by the y co-ordinate axis. The projections 19, 20 extend in the direction of the z co-ordinate axis at least as far as the x-y plane in which the magnetoresistive sensor arrangement 10 is positioned. It is thereby achieved in a simple and effective way that the magnetic field H impressed on the arrangement is homogeneously formed in the area of the spatial extension of the magnetoresistive sensor arrangement 10.

For the sake of clarity, the alignments of the barberpole structures are shown in FIG. 4 by way of shaded areas which are similar to those in FIG. 2.

Since offset parts $H_{offi}$ of the magnetic field strength of the measuring field at the sensor elements 11, 12, 13, 14 vanish for a homogeneous magnetic field, the relation $$H_{off1} = H_{off2} = -H_{off3} = -H_{off4} = H_{off} = 0$$

is obtained for the output signal UA10 of the magnetoresistive sensor arrangement 10 in the following implementation according to the invention:

$$UA10/UB = (S\ H_{pk}/R_0)\cos(n\Phi)\sin(n\Delta y/r)$$

The output signal UA10 of the magnetoresistive sensor arrangement 10 in the implementation according to the invention is thus no longer dependent on influences by particularly interfering external magnetic fields or mounting tolerances, for example, of the distance between the motion sensor element 9 and the magnetoresistive sensor arrangement 10.

The output signal UA10 of the magnetoresistive sensor arrangement 10 in the implementation according to the invention also provides an unambiguous detection whether the motion sensor element 9 is in front of the magnetoresistive sensor arrangement 10 with a tooth or with a gap between two teeth. In one position of the motion sensor element 9, in which the center of a tooth, reckoned in the direction of the motion co-ordinate $\Phi$, is situated at the zero point y=0 of the y co-ordinate system, i.e. opposite the spatial central axis of the magnetoresistive sensor arrangement 10, the following relation, with $$n\Phi = 0, 2\pi, 4\pi, \ldots$$

holds for the cosine term in the equation for the output signal UA10 of the magnetoresistive sensor arrangement 10:

$$\cos(n\Phi) = 1$$

In a corresponding manner, in a position of the motion sensor element 9, in which the center between two teeth, reckoned in the direction of the motion co-ordinate $\Phi$, is situated at the zero point y=0 of the y co-ordinate system, i.e. opposite the spatial central axis of the magnetoresistive sensor arrangement 10, the following relation, with $$n\Phi = 0, \pi, 3\pi, \ldots$$

holds for the cosine term in the equation for the output signal UA10 of the magnetoresistive sensor arrangement 10:

$$\cos(n\Phi) = -1$$

Thus, an unambiguous distinction between a tooth and a gap can be made.

In a modification of the arrangement of FIG. 4, the magnetoresistive sensor arrangement 10 may also be surrounded in the direction of the x co-ordinate axis by projections of the working magnet 18 which are preferably formed in at least substantially the same way as the projections 19, 20. The magnetic field H is thereby homogenized, also in the direction of the x co-ordinate.

List of Reference Signs
1 first sensor element of the magnetoresistive sensor arrangement 7
2 second sensor element of the magnetoresistive sensor arrangement 7
3 third sensor element of the magnetoresistive sensor arrangement 7
4 fourth sensor element of the magnetoresistive sensor arrangement 7
5 first power supply terminal (for first power supply potential UB)
6 second power supply terminal (for ground potential M)
7 magnetoresistive sensor arrangement
8 working magnet for magnetoresistive sensor arrangement 7
9 rotating motion sensor element
10 gradient sensor
11 first sensor element of the gradient sensor 10
12 second sensor element of the gradient sensor 10
13 third sensor element of the gradient sensor 10
14 fourth sensor element of the gradient sensor 10
15 first tap on the magnetoresistive sensor arrangement 10
16 second tap on the magnetoresistive sensor arrangement 10
17 spatial central axis of the magnetoresistive sensor arrangement 10
18 working magnet for the gradient sensor 10
19 projection of the working magnet 18
20 projection of the working magnet 18
21 symbol for the alignment of the barberpole structures in sensor element 11
22 symbol for the alignment of the barberpole structures in sensor element 12
23 symbol for the alignment of the barberpole structures in sensor element 13
24 symbol for the alignment of the barberpole structures in sensor element 14
H magnetic field of the working magnet
$H_i$ magnetic field strength of the measuring field at the sensor element i with the resistance Ri
$H_{ex}$ magnetic field strength of an external magnetic field superimposed throughout the plane of the sensor arrangement 7, particularly an interference field, at the sensor element i
$H_{offi}$ offset part of the magnetic field strength of the measuring field at the sensor element i
$H_{off}$ amount of the offset part of the magnetic field strength of the measuring field
at the sensor element 11, 12, 13, 14 (FIGS. 2, 3)
$H_{pk}$ amplitude of the magnetic field strength of the measuring field at the sensor element i
i index with i=11, 12, 13, 14
M second power supply potential (=ground potential)
n number of teeth on the motion sensor element 9 formed as a sensor wheel
r radius of the motion sensor element 9 formed as a sensor wheel
$R_O$ resistance of the individual sensor elements i at the working point
Ri resistance of the sensor element denoted by i
S resistance change of the resistances Ri in dependence upon the measuring field, i.e. the slope of the R-H characteristic curve of the sensor elements denoted by i or the sensitivity of the sensor elements denoted by i
UA output signal of the sensor arrangement 7
UA10 output signal of the sensor arrangement 10 (=gradient sensor)
UB first power supply potential
x co-ordinate axis
y co-ordinate axis
$y_i$ co-ordinate of the sensor element i along the y co-ordinate axis
z co-ordinate axis
$\alpha_i$ angle of the direction of the current through the sensor element i upon a vanishing measuring field $H_i$ at the location of the sensor element denoted by i
Δy value of the co-ordinate of the sensor elements 11, 12, 13, 14 of the magnetoresistive sensor arrangement 10
Φ motion co-ordinate of the rotating motion sensor element 9 (e.g. crankshaft angle of rotation)

The invention claimed is:

1. An arrangement for determining the position of a motion sensor element influencing the formation of a magnetic field, impressed on the arrangement, periodically along its motion co-ordinate, the arrangement comprising
   a sensor arrangement which is sensitive along a measuring direction aligned at least substantially parallel to the motion co-ordinate of the motion sensor element to at least the polarity of the magnetic field impressed on the arrangement and is adapted to supply a measuring signal in dependence upon a field component of the magnetic field impressed on the arrangement, denoted as measuring field and measured in the measuring direction,
   wherein the motion sensor element, arranged in a strip-shaped zone of a main surface extending along the motion co-ordinate of the motion sensor element, comprises periodically recurrent areas alternately influencing the measuring field which is being formed parallel to the main surface and is at least substantially parallel to the motion co-ordinate of the motion sensor element, and the measuring direction of the sensor element is aligned at least substantially parallel to the main surface of the motion sensor element,
   wherein the magnetic field impressed on the arrangement is aligned substantially perpendicular to the main surface of the motion sensor element with its main component determined by the principal direction of the magnetic field lines,
   wherein the sensor arrangement is formed as a magnetoresistive sensor arrangement for measuring gradients of the magnetic field, and
   wherein the magnetic field impressed on the arrangement is formed homogeneously in the area of the spatial extension of the magnetoresistive sensor arrangement by a working magnet for impressing the magnetic field on the arrangement, in which the main component of the magnetic field lines of the magnetic field emanating from the working magnet is aligned at least substantially perpendicular to the main surface of the motion sensor element; and wherein a flat surface portion of said working magnet is substantially coplanar with said sensor arrangement.

2. An arrangement as claimed in claim 1, characterized in that the working magnet in one of its upper surfaces facing the magnetoresistive sensor arrangement and being aligned substantially parallel thereto comprises projections directed towards the main surface of the motion sensor element in the direction of the main component of the magnetic field lines of the magnetic field emanating from the working magnet, substantially perpendicular to said main surface of the motion sensor element, said projections comprising the area of the spatial extension of the magnetoresistive sensor arrangement in at least the measuring direction.

3. An arrangement as claimed in claim 1, characterized in that the motion sensor element is linear.

4. An arrangement as claimed in claim 1, characterized in that the motion sensor element is rotationally symmetrical.

5. An arrangement as claimed in claim 1, characterized in that the magnetoresistive sensor arrangement is formed for measuring gradients of the magnetic field with at least a Wheatstone bridge configuration whose bridge branches each comprise a magnetoresistive sensor element, and in which two series-arranged bridge branches each constitute a half bridge of the Wheatstone bridge configuration.

6. An arrangement as claimed in claim 5, characterized in that the magnetoresistive sensor elements are formed with barber-pole structures, in that the barberpole structures in the magnetoresistive sensor elements of a half bridge of the Wheatatone bridge circuit are at least substantially aligned in a corresponding manner, and in that the alignment of the barberpole structures in the magnetoresistive sensor elements in at least one of the half bridges of the Wheatstone bridge circuit is chosen to be different from the alignment of the barberpole structures in the magnetoresistive sensor elements in at least another one of the half bridges of the Wheatetone bridge circuit.

7. An arrangement as claimed in claim 6, characterized in that the Wheatstone bridge circuit comprises a first half bridge of the series arrangement of a first and a third bridge branch and a second half bridge of the series arrangement of a second and a fourth bridge branch, in that the first, second, third and fourth bridge branch are formed with a first, a second, a third and a fourth magnetoresistive sensor element, and in that the barberpole structures of the first and the third magnetoresistive sensor element are aligned substantially right-angled to the barberpole structures of the second and the fourth magnetoresistive sensor element.

8. An arrangement as claimed in claim 7, characterized in that the magnetoresistive sensor elements have predetermined co-ordinates along a co-ordinate axis extending in the measuring direction, in that the co-ordinates of the first and the second magnetoresistive sensor element, on the one hand, and the co-ordinates of the third and the fourth magnetoresistive sensor element, on the other hand, at least substantially correspond to each other, and in that the co-ordinates of the first and the second magnetoresistive sensor element are chosen to be symmetrical to the co-ordinates of the third and the fourth magnetoresistive sensor element with reference to a point of reference on the co-ordinate axis extending in the measuring direction.

9. An arrangement as claimed in claim 1, characterized in that the zones of periodically recurrent areas alternately influencing the measuring field are constituted by projections alternating with indentations substantially perpendicular to the main surface of the motion sensor element, which projections and indentations are formed from a magnetizable material comprised by the motion sensor element.

* * * * *